(12) United States Patent
Shaddock et al.

(10) Patent No.: US 10,784,881 B1
(45) Date of Patent: Sep. 22, 2020

(54) BLENDED ANTI-ALIASING ANALOG-TO-DIGITAL CONVERSION FOR DIGITAL TEST AND MEASUREMENT DEVICES

(71) Applicant: Liquid Instruments Pty Ltd., Lyneham (AU)

(72) Inventors: Daniel Anthony Shaddock, Kaleen (AU); Danielle Marie Rawles Wuchenich, Woodside, CA (US); Paul Anthony Altin, O'Connor (AU); Timothy Tien-Yue Lam, Crace (AU); Max Andrew Gordon Schwenke, Crace (AU); Benjamin Paul Coughlan, Braddon (AU); David Sebastiaan Rabeling, Bruce (AU)

(73) Assignee: Liquid Instruments Pty Ltd., Lyneham. ACT (AU)

( * ) Notice: Subject to any disclaimer, the term of this patent is extended or adjusted under 35 U.S.C. 154(b) by 0 days.

(21) Appl. No.: 16/685,166

(22) Filed: Nov. 15, 2019

(51) Int. Cl.
*H03M 1/06* (2006.01)
*G01R 31/317* (2006.01)

(52) U.S. Cl.
CPC .... *H03M 1/0629* (2013.01); *G01R 31/31724* (2013.01)

(58) Field of Classification Search
CPC .... H03M 3/344; H03M 1/0629; H03M 1/128; H03M 1/1071; G01R 23/167; G01R 23/165; G01R 31/31724
USPC ............................................... 324/750
See application file for complete search history.

(56) References Cited

U.S. PATENT DOCUMENTS

| | | | | |
|---|---|---|---|---|
| 4,803,727 A * | 2/1989 | Holt | ..................... | H04B 14/046 381/1 |
| 4,943,807 A * | 7/1990 | Early | ..................... | H03M 3/38 341/120 |
| 5,659,546 A * | 8/1997 | Elder | ..................... | H03M 1/121 370/343 |
| 6,172,635 B1 * | 1/2001 | Nakamura | ........... | H03M 1/188 341/155 |
| 6,441,843 B1 * | 8/2002 | Limberg | ............... | H04N 5/211 348/21 |

(Continued)

OTHER PUBLICATIONS

Wikner, Jacob J., TSTE16—Mixed-Signal Processing Systems. LIU—Dept of Engineering. 2013. (Year: 2013).*

(Continued)

*Primary Examiner* — Douglas X Rodriguez
*Assistant Examiner* — Sean Curtis
(74) *Attorney, Agent, or Firm* — Innovators Legal

(57) ABSTRACT

The present disclosure relates to blended analog-to-digital conversion for digital test and measurement devices. A first analog-to-digital converter (ADC) converts an analog signal into a first digital signal a first sampling rate. A digital filtering component generates a filtered digital signal by processing the first digital signal. An analog low pass filter filters the analog signal to generate a filtered analog signal. A second ADC converts the filtered analog signal into a second digital signal. A digital subtractor circuit subtracts the filtered digital signal from the first digital signal or the second digital signal. A digital adder circuit generates a blended digital signal by processing an output of the digital subtractor circuit and one of the first digital signal or the second digital signal.

19 Claims, 3 Drawing Sheets

(56) References Cited

U.S. PATENT DOCUMENTS

| | | | | |
|---|---|---|---|---|
| 6,590,944 B1* | 7/2003 | Kroeger | | H04H 60/11 |
| | | | | 375/340 |
| 6,735,257 B2* | 5/2004 | Kroeger | | H04H 60/11 |
| | | | | 375/295 |
| 6,975,257 B2* | 12/2005 | Reefman | | H03M 3/344 |
| | | | | 118/120 |
| 7,428,464 B2 | 9/2008 | Nara | | |
| 7,952,502 B2* | 5/2011 | Kolze | | H03M 1/1033 |
| | | | | 341/118 |
| 7,953,183 B2* | 5/2011 | Shridhar | | H04H 40/18 |
| | | | | 375/316 |
| 8,508,393 B2* | 8/2013 | Ueno | | H03M 1/0612 |
| | | | | 341/118 |
| 8,917,198 B2* | 12/2014 | Pagnanelli | | H03M 3/468 |
| | | | | 341/143 |
| 9,007,251 B2* | 4/2015 | Perthold | | H03M 1/0678 |
| | | | | 341/155 |
| 9,112,524 B2 | 8/2015 | Snelgrove | | |
| 9,414,156 B2 | 8/2016 | Bithell et al. | | |
| 9,543,978 B2* | 1/2017 | Mattisson | | H03M 3/464 |
| 9,787,316 B2* | 10/2017 | Shu | | H03M 1/0673 |
| 9,813,267 B1* | 11/2017 | Barghi | | H04L 27/3863 |
| 9,831,885 B2* | 11/2017 | Shu | | H03M 1/001 |
| 9,837,990 B1* | 12/2017 | Pagnanelli | | H03M 3/322 |
| 9,973,172 B2* | 5/2018 | Pagnanelli | | H03M 3/414 |
| 10,637,490 B2* | 4/2020 | Nikitin | | H03M 3/344 |
| 10,698,027 B1* | 6/2020 | Shaddock | | G01R 31/3167 |
| 2013/0136202 A1* | 5/2013 | Kummetz | | H04B 7/04 |
| | | | | 375/267 |
| 2016/0036460 A1* | 2/2016 | Mattisson | | H03M 3/454 |
| | | | | 341/110 |
| 2017/0077937 A1* | 3/2017 | Shu | | H03M 1/0673 |
| 2017/0230056 A1* | 8/2017 | Shu | | H03M 1/066 |
| 2018/0062623 A1* | 3/2018 | Pagnanelli | | H03M 3/468 |
| 2019/0245549 A1* | 8/2019 | Nikitin | | H03H 17/0219 |
| 2020/0169279 A1* | 5/2020 | Gunturi | | H04B 1/30 |

OTHER PUBLICATIONS

Venmuri, Arun T., Exploring anti-aliasing filters in signal conditioners for mixed-signal, multimodal sensor conditioning. Texas Instruments Inc. Analog Applications Journdal—3Q—2013. (Year: 2013).*

U.S. Appl. No. 16/685,157, Notice of References dated Feb. 7, 2020.

* cited by examiner

BLENDED ANTI-ALIASING ANALOG-TO-DIGITAL CONVERSION FOR DIGITAL TEST AND MEASUREMENT DEVICES

BACKGROUND

Electronic test and measurement equipment can create signals and capture signal responses from electronic devices under test. Digital test and measurement devices can process signals to provide a variety of functionalities. However, where the processing is performed digitally, each functionality can be limited by the performance of the analog-to-digital converter (ADC) used to digitize the analog signal. It can be difficult for a single ADC to address all performance requirements of the various functionalities that can be performed by the digital test and measurement device.

BRIEF DESCRIPTION OF THE DRAWINGS

Many aspects of the present disclosure are better understood with reference to the following drawings. The components in the drawings are not necessarily drawn to scale, with emphasis instead being placed upon clearly illustrating the principles of the disclosure. In the drawings, like reference numerals designate corresponding parts throughout the several views.

DETAILED DESCRIPTION

The present disclosure relates to systems and methods for blended analog-to-digital conversion for digital test and measurement devices. Digital test and measurement devices can process signals to perform functionalities of many different stand-alone instruments. However, each functionality can be limited by the quality of the analog-to-digital conversion used to digitize the analog signal. The present disclosure describes mechanisms that can optimize analog-to-digital conversion by blending digitized signals from multiple analog-to-digital converters.

Some aspects of the present disclosure describe a reconfigurable test and measurement device for generating a blended digital signal from an analog signal. The test and measurement device can include a first analog-to-digital converter (ADC) that converts the analog signal into a first digital signal at a first sampling rate. An analog low pass filter can filter the analog input signal to generate a filtered analog signal. A second ADC can convert the filtered analog signal into a second digital signal at a second sampling rate that is lower than the first sampling rate. A digital low pass filter can output a filtered digital signal. In some embodiments, the digital low pass filter can be configured to match a cutoff frequency and a roll off rate of the analog low pass filter. In some examples, a decimator circuit can generate a filtered downsampled digital signal that matches the second sampling rate. A digital subtractor circuit can subtract the filtered downsampled digital signal from the first digital signal or the second digital signal. For example, the digital subtractor circuit can subtract the filtered downsampled digital signal from the second digital signal, and the digital adder circuit can generate the blended digital signal based at least in part on the output of the digital subtractor circuit and the first digital signal. Alternatively, the digital subtractor circuit can subtract the filtered downsampled digital signal from the first digital signal, and the digital adder circuit can generate the blended digital signal based at least in part on the output of the digital subtractor circuit and the second digital signal. A digital adder circuit can generate a blended digital signal based at least in part on an output of the digital subtractor circuit. In some embodiments, the first ADC is configured for high-frequency fidelity and the second ADC is configured for low-frequency fidelity. In some embodiments, the first digital output can include an interleaved digital signal. In some embodiments, the reconfigurable test and measurement device can process the blended digital signal to provide a particular functionality of a traditional standalone instrument, and can generate a user interface that includes at least one visualization for the functionality, based on the blended digital signal.

Figure 1:
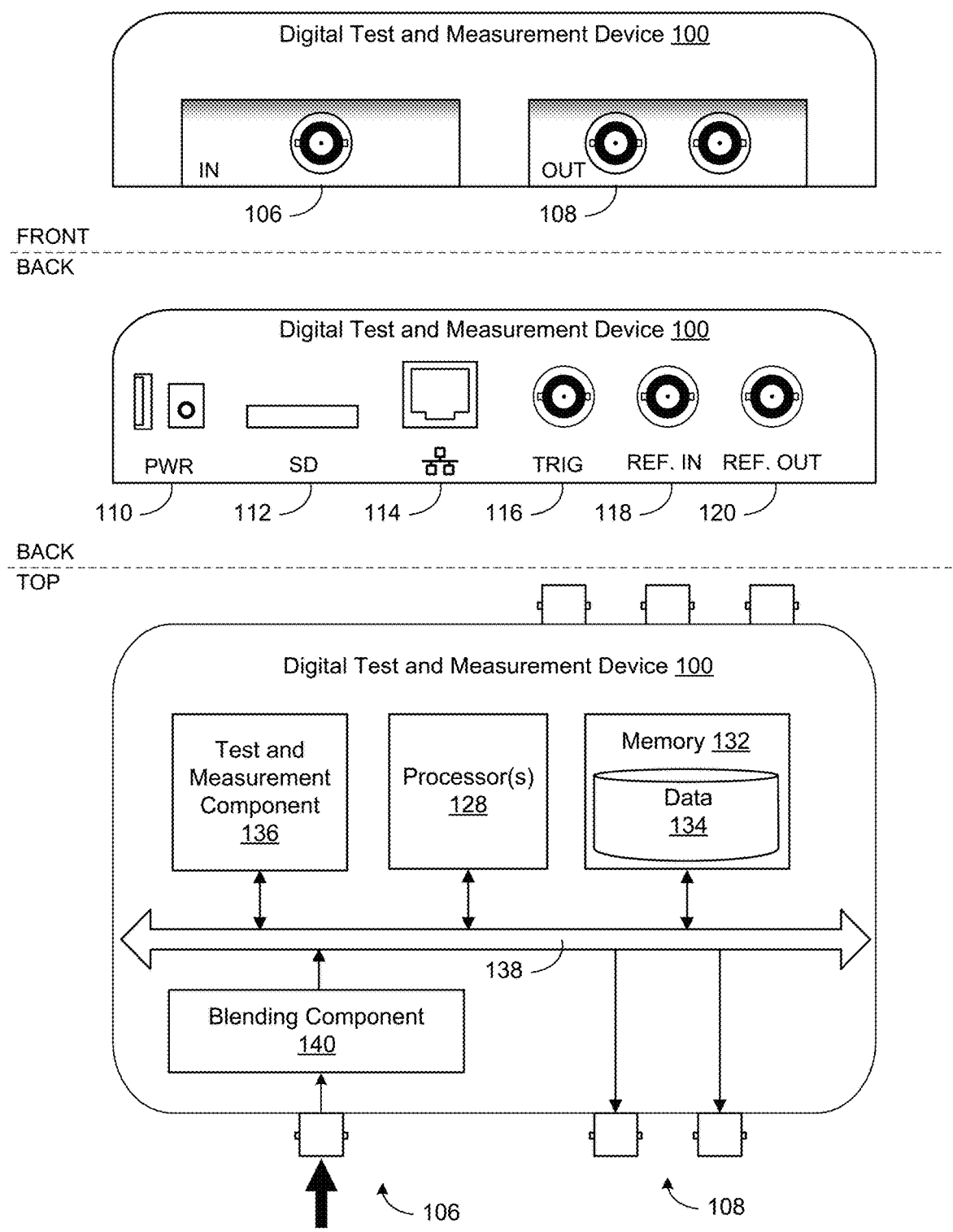
FIG. 1 is a drawing that illustrates an example digital test and measurement device with blended analog-to-digital conversion, according to various embodiments of the present disclosure.

Moving now to the figures, FIG. 1 shows a digital test and measurement device 100. The digital test and measurement device 100 can be reconfigurable or reprogrammable to update one of the functionalities provided, or to provide additional new functionalities. The digital test and measurement device 100 can include one or more analog inputs 106 or analog input channel. The digital test and measurement device 100 can include one or more output channels 108 such as an analog output channel. Analog output channels can be converted from digitally processed functionalities using a digital-to-analog converter (DAC). The analog inputs 106 and the outputs 108 can include BNC quick connectors, other coaxial connectors, or other appropriate connectors for analog connections.

The digital test and measurement device 100 can include one or more power input 110. For example, a Universal Serial Bus (USB) power input 110 or another standard for power inputs 110 such as DC power inputs 110 or AC power inputs 110. A USB input 110 can be used for power, but can also provide data and/or network connectivity to the digital test and measurement device 100. In some embodiments, the digital test and measurement device 100 can include AC to DC converter circuitry. The digital test and measurement device 100 can include a digital media port 112 such as an SD card port, microSD card port, or another type of port for another type of memory card or storage device. The digital test and measurement device 100 can process an input to provide any of the functionalities described, and can store an output based on any of these functionalities directly to the storage device for later use.

The digital test and measurement device 100 can include a network port 114. The network port 114 can include an Ethernet port, for example, an RJ-45 port or another type of network port. The network port 114 can provide input and output to a networked client device such as a phone device, a tablet device, another handheld computing device, or any computing device. This can enable real time functionality switching and measurement readout. Control inputs can be received through a user interface of a suite of control software such as Python, LabVIEW™, and MATLAB®, among others. The digital test and measurement device 100 can process an input to provide any of the functionalities described and display them on a computing device through the network port 114. The digital test and measurement device 100 can also include a wireless communication device capable of providing the same functionalities and receiving control inputs through wireless network communications that utilize Wi-Fi, Bluetooth, and other wireless communications protocols.

The digital test and measurement device 100 can also include a trigger input 116, a reference input 118, and a reference output 120. The trigger input can provide for external triggering. The reference input 118 can include a 10 MHz reference input. The reference output 120 can include a 10 MHz reference output.

The digital test and measurement device 100 can also include computing capability through at least one processing system, for example, having a processor 128 and a memory 132, both of which are electrically and communicatively coupled to a local interface 138. The local interface 138 can be embodied as a data bus with an accompanying address/control bus or other addressing, control, and/or command lines, for data communications and addressing between the processor 128, the memory 132, and the test and measurement component 136. The test and measurement component 136 can be provided as a distinct hardware component and/or as instructions stored in the memory 132 and executed by the processor 128.

The digital test and measurement device 100 can include a blending component 140. The blending component 140 can optimize analog-to-digital conversion by blending digitized signals from multiple analog-to-digital converters. The blending component 140 can generate a blended digital signal based on an analog signal input, and provide the blended digital signal to the test and measurement component 136, which further processes this digital signal to provide instrument-based functionalities such as an oscilloscope functionality, spectrum analyzer, waveform generator, data logger, arbitrary waveform generator, FIR filter builder, PID controller, laser lock box, lock-in amplifier, frequency response analyzer, phasemeter, or digital filter box functionality. By utilizing the blending component 140 to perform the analog-to-digital conversion, the digital test and measurement device 100 can provide high fidelity analyses over all frequencies, without losing fidelity of high or low frequencies. The blending component 140 is discussed in further detail with respect to FIGS. 2A and 2B.

By providing the functionalities of many traditional test and measurement devices, the digital test and measurement device 100 can implement these functions using a compact design. The digital test and measurement device 100 can be remotely controlled through its own user interface, for example through a computing device on an ad hoc or other wireless network, or through a wired connection. The digital test and measurement device 100 can also be controlled using Python, LabVIEW™, and MATLAB®. Settings such as scales, measurements, cursors, and input impedance can be saved in the memory 132 automatically when switching between instruments or functionalities for consistent measurements. The digital test and measurement device 100 can also save the data 134 in MAT and CSV formats, and transmit the data 134 to an Internet-connected computing device via email, Dropbox®, and iCloud®, among others.

In various embodiments, the memory 132 stores data 134 and other software or executable-code components executable by the processor 128. The data 134 can include data related to the operation of the digital test and measurement device 100, and other data. Among others, the executable-code components can include components associated with the test and measurement component 136 and/or an operating system for execution by the processor 128. Where any component discussed herein is implemented in the form of software, any one of a number of programming languages can be employed such as, for example, C, C++, C #, Objective C, JAVA®, JAVASCRIPT®, Perl, PHP, VISUAL BASIC®, PYTHON®, RUBY, FLASH®, or other programming languages.

The memory 132 stores software for execution by the processor 128. In this respect, the terms "executable" or "for execution" refer to software forms that can ultimately be run or executed by the processor 128, whether in source, object, machine, or other form. Examples of executable programs include, for example, a compiled program that can be translated into a machine code format and loaded into a random access portion of the memory 132 and executed by the processor 128, source code that can be expressed in an object code format and loaded into a random access portion of the memory 132 and executed by the processor 128, or source code that can be interpreted by another executable program to generate instructions in a random access portion of the memory 132 and executed by the processor 128, etc.

In various embodiments, the memory 132 can include both volatile and nonvolatile memory and data storage components. Volatile components are those that do not retain data values upon loss of power. Nonvolatile components are those that retain data upon a loss of power. Thus, the memory 132 can include, a random access memory (RAM), read-only memory (ROM), magnetic or other hard disk drive, solid-state, semiconductor, universal serial bus (USB) flash drive, memory card, optical disc (e.g., compact disc (CD) or digital versatile disc (DVD)), floppy disk, magnetic tape, or any combination thereof. In addition, the RAM can include, for example, a static random access memory (SRAM), dynamic random access memory (DRAM), or magnetic random access memory (MRAM), and/or other similar memory device. The ROM can include, for example, a programmable read-only memory (PROM), erasable programmable read-only memory (EPROM), electrically erasable programmable read-only memory (EEPROM), or other similar memory device. An executable program can be stored in any portion or component of the memory 132.

The processor 128 and the test and measurement component 136 can be embodied as one or more microprocessors, one or more discrete logic circuits having logic gates for implementing various logic functions, application specific integrated circuits (ASICs) having appropriate logic gates, and/or programmable logic devices (e.g., field-programmable gate array (FPGAs), and complex programmable logic devices (CPLDs)).

If embodied in software, the test and measurement component 136 can represent a module or group of code that includes program instructions to implement the specified logical function(s) discussed herein. The program instructions can be embodied in the form of source code that includes human-readable statements written in a programming language or machine code that includes machine instructions recognizable by a suitable execution system, such as a processor in a computer system or other system. Thus, the processor 128 can be directed by execution of the program instructions to perform certain processes, such as those illustrated in the flowcharts described herein. In the context of the present disclosure, a non-transitory computer-readable medium can be any tangible medium that can contain, store, or maintain any logic, application, software, or executable-code component described herein for use by or in connection with an instruction execution system.

Also, one or more of the components described herein that include software or program instructions can be embodied in a non-transitory computer-readable medium for use by or in connection with an instruction execution system, such as the processor 128. The computer-readable medium can contain, store, and/or maintain the software or program instructions for execution by or in connection with the instruction execution system. The computer-readable medium can include a physical media, such as, magnetic, optical, semiconductor, and/or other suitable media or drives. Further, any logic or component described herein can be implemented and structured in a variety of ways. For example, one or more components described can be implemented as modules or components of a single application. Further, one or more components described herein can be executed in one computing device or by using multiple computing devices.

Figure 2A:
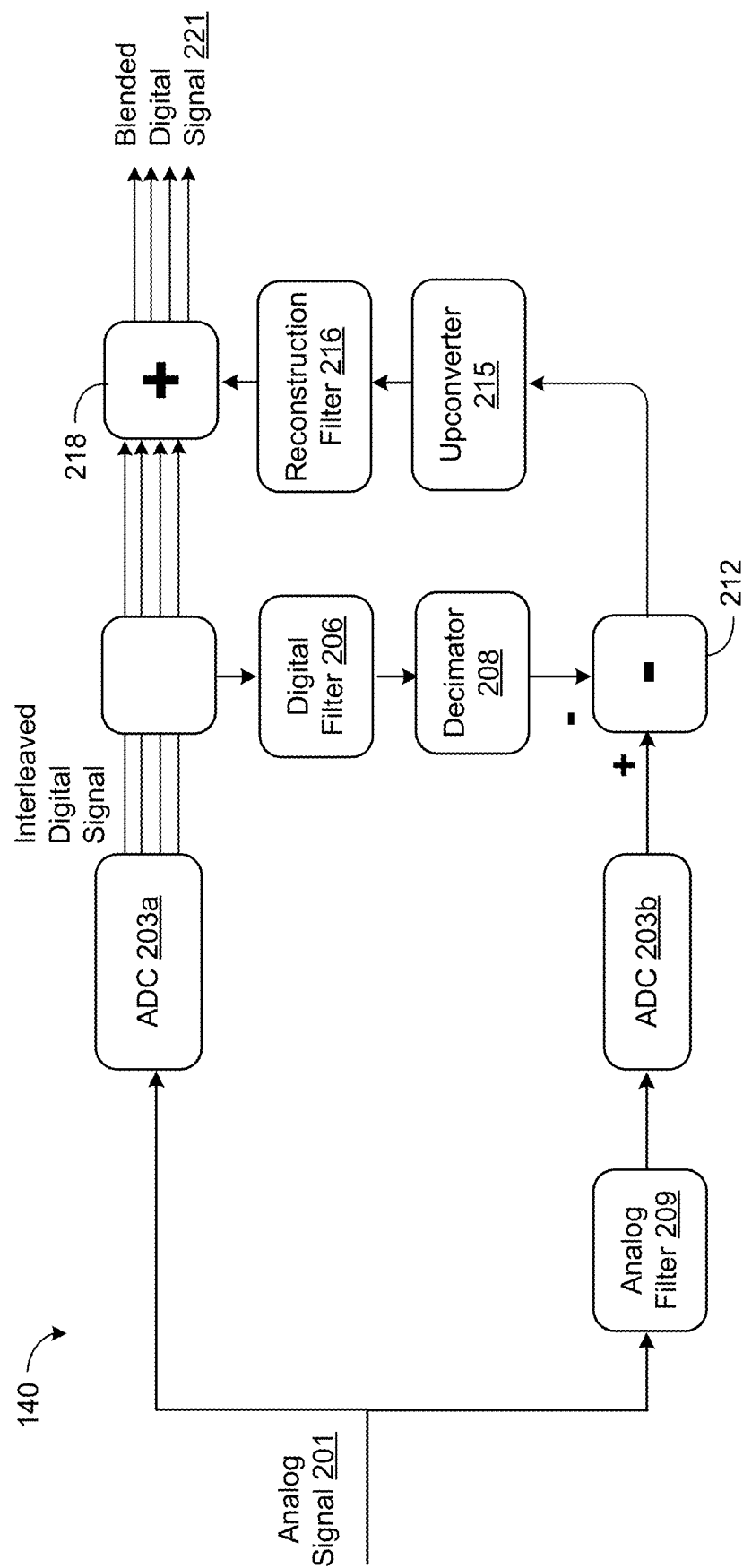
FIG. 2A is a drawing that illustrates an example of blending circuitry for blended analog-to-digital conversion for the example digital test and measurement device of FIG. 1, according to various embodiments of the present disclosure.

FIG. 2A shows an example of the blending component 140. The blending component 140 can take an analog input signal 201 that is input, for example, through an analog input 106 of the digital test and measurement device 100. The blending component 140 can simultaneously provide the analog input signal 201 to two or more frequency-domain paths configured or designed for different frequency ranges based on the ADCs and filters in each path. For example the ADC 203a can be designed for high fidelity at high frequencies that include a range of frequencies that are over a predetermined threshold frequency, while the ADC 203b can be designed for high fidelity at low frequencies that include a range of frequencies lower than the predetermined threshold frequency. The ADC 203a can include a higher sampling rate than the ADC 203b. The ADC 203a can be designed with ADC parameters that provide high fidelity at high frequencies that include a range of frequencies over a predetermined threshold frequency. ADC parameters that provide high fidelity at high frequencies include, for example, low levels of white noise, high sampling rate, low harmonic distortion.

The ADC 203b can also be designed for high fidelity at a particular range of frequencies. However, the ADC 203b can be designed for high fidelity at a different set of frequencies than the ADC 203a. The ADC 203b can be designed with ADC parameters that provide high fidelity at low frequencies that include a range of frequencies under the predetermined threshold frequency. ADC parameters that provide high fidelity at low frequencies include, for example, a low 1/f (or pink) noise corner frequency, a high DC precision, high number of bits, high gain stability.

The threshold frequency can be used as a corner frequency or cutoff frequency of both a digital filter 206 and the analog filter 209. In some examples, the digital filter 206 and the analog filter 209 can include matching low pass filters. For example, the analog filter 209 and the digital filter 206 can have matching cutoff or corner frequencies and matching roll off rates or slopes.

The digital signal output from the ADC 203a can be filtered and decimated by the digital filter 206 and decimator 208, and provided as an input to the digital subtractor 212. In some cases, the digital filter 206 and decimator 208 can be performed by a single digital component that filters and decimates the digital signal from the ADC 203a. This can result in a filtered digital signal that matches a sampling rate of the ADC 203b. Thus, an output from the ADC 203b can be differenced (or summed) with the filtered and decimated digital signal. In the example shown, the filtered and decimated digital signal is subtracted from a filtered digital signal output from the ADC 203b.

The analog filter 209 can output a filtered analog signal based on the analog signal, and provide the filtered analog signal to the ADC 203b. The ADC 203b can perform an analog-to-digital conversion and provide a filtered digital signal with a particular sampling rate. The ADC 203b can provide this filtered digital signal to the digital subtractor 212.

The analog filter 209 can prevent aliasing of high frequency signals in the data stream of the lower sampling rate ADC 203b. However, an analog anti-aliasing filter can be imperfect even if the cut-off frequency is well below the Nyquist frequency. Aliased signals could still be present. The arrangements described herein reduce the sample rate of the higher speed ADC 203a during or after filtering with a digital filter 206 that has parameters that are matched to the analog filter 209. As a result, the aliasing of the signals can be common to both data streams and cancel when they are differenced for example, by the digital subtractor 212 as part of the blending process. Thus, aliasing can be cancelled out in the blended digital signal 221 that is output from the blending component 140.

The output from the digital subtractor 212 can be upconverted using an upconverter 215 and passed through a reconstruction filter 216. The upconverter 215 can generate an upconverted digital signal. The reconstruction filter can be a low-pass filter that is designed to remove any images or artifacts of the low frequency spectrum introduced by upsampling.

The adder 218 can add or sum the outputs from each frequency-domain path to generate a blended digital signal 221. Specifically, the digital adder 218 can sum or add the upconverted and filtered output from the digital subtractor 212 to the digital signal output from the ADC 203a. Accordingly, the blended digital signal 221 can have high fidelity at both high and low frequencies by effectively blending the outputs from specialized ADCs.

Figure 2B:
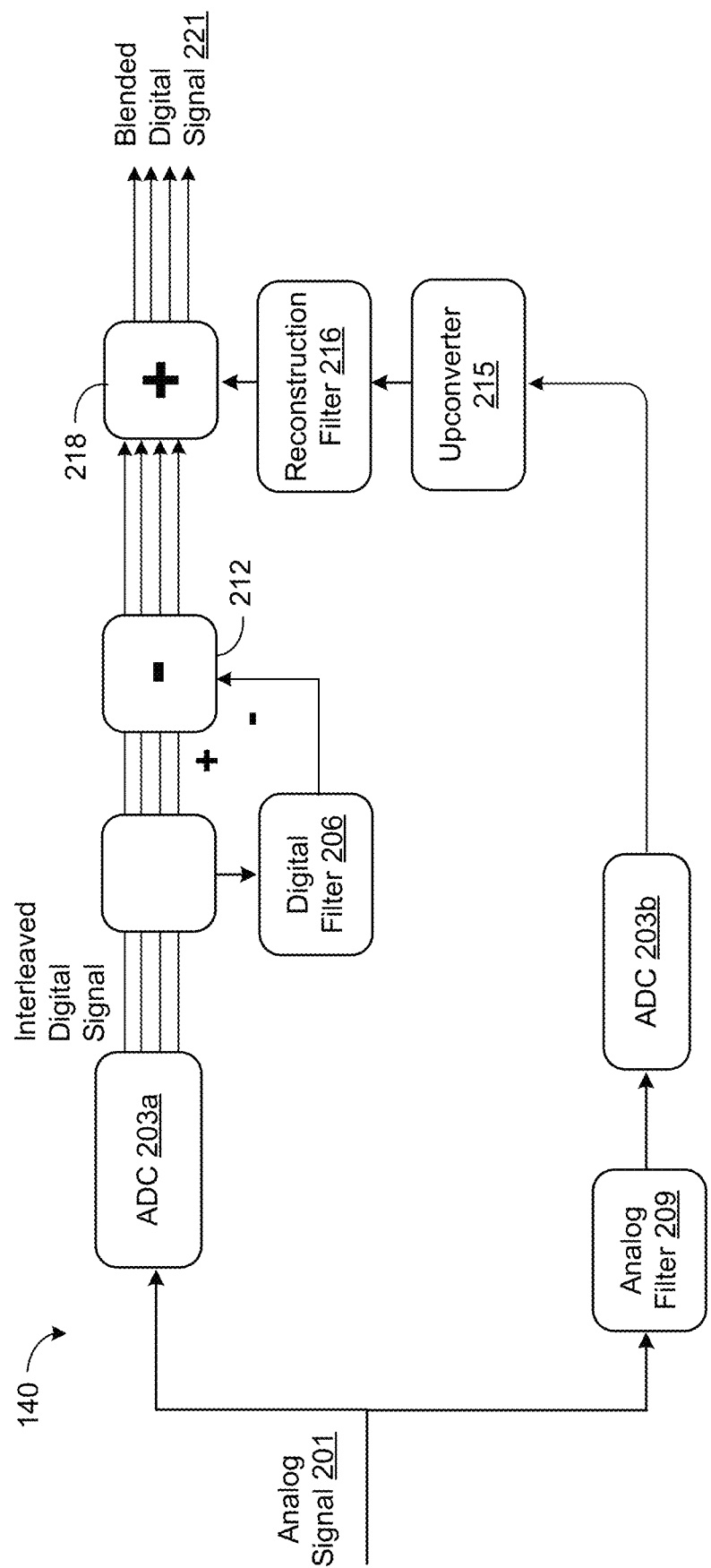
FIG. 2B is a drawing that illustrates another example of blending circuitry for blended analog-to-digital conversion for the example digital test and measurement device of FIG. 1, according to various embodiments of the present disclosure.

FIG. 2B shows another example of the blending component 140. This embodiment is similar to that shown in FIG. 2A, except the output from the digital filter 206 is subtracted from the digital signal output from the ADC 203a, and the filtered digital signal output from the ADC 203b is provided directly to the upconverter 215 rather than first subtracting the output from the digital filter 206. Because the digital subtractor 212 subtracts the output from the low-pass digital filter 206 from the digital signal output from the ADC 203a, its output can be referred to as a high-passed digital signal. Low frequencies can be reintroduced by the summation with the filtered digital signal output from the ADC 203b, which has characteristics better suited for low frequencies.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

The invention claimed is:

1. A reconfigurable test and measurement device for generating a blended digital signal from an analog signal, the blended digital signal having high fidelity to the analog signal over multiple frequency domains, the reconfigurable test and measurement device comprising:
- a first analog-to-digital converter (ADC) that converts the analog signal into a first digital signal, the first ADC comprising a first sampling rate;
- a digital filtering component that generates a filtered downsampled digital signal by processing the first digital signal;
- an analog low pass filter that filters the analog signal to generate a filtered analog signal;
- a second ADC that converts the filtered analog signal into a second digital signal, the second ADC comprising a second sampling rate that is lower than the first sampling rate;
- a digital subtractor circuit that subtracts the filtered downsampled digital signal from the second digital signal; and
- a digital adder circuit that generates the blended digital signal based at least in part on a sum of the first digital signal and an output of the digital subtractor circuit.

2. The reconfigurable test and measurement device of claim 1, wherein the digital filtering component comprises a digital low pass filter configured to match a cutoff frequency and a roll off rate of the analog low pass filter.

3. The reconfigurable test and measurement device of claim 1, wherein the first ADC is configured for high-frequency fidelity and the second ADC is configured for low-frequency fidelity.

4. The reconfigurable test and measurement device of claim 1, wherein the first digital signal comprises an interleaved digital signal.

5. The reconfigurable test and measurement device of claim 1, wherein the reconfigurable test and measurement device generates a user interface comprising at least one visualization based at least in part on the blended digital signal.

6. The reconfigurable test and measurement device of claim 1, wherein the blended digital signal is processed to provide a particular instrument-based functionality comprising at least one of: oscilloscope functionality, spectrum analyzer functionality, waveform generator functionality, data logger functionality, arbitrary waveform generator functionality, FIR filter builder, PID controller functionality, laser lock box functionality, lock-in amplifier functionality, frequency response analyzer functionality, phasemeter functionality, or digital filter box functionality.

7. The reconfigurable test and measurement device of claim 1, wherein an instrument functionality output is generated based on the blended digital signal, and the instrument functionality output is transmitted to a computing device.

8. A method for generating a blended digital signal for a digital test and measurement device, the method comprising:
- converting, using a first analog-to-digital converter (ADC) comprising a first sampling rate, an analog signal into a first digital signal;
- processing, by a digital filtering component, the first digital signal to generate a filtered digital signal;
- generating a filtered analog signal using an analog low pass filter that filters the analog signal;
- converting, using a second ADC comprising a second sampling rate that is lower than the first sampling rate, the filtered analog signal into a second digital signal;
- subtracting, using a digital subtractor circuit, the filtered digital signal from the first digital signal or the second digital signal; and
- generating, using a digital adder circuit, a blended digital signal based at least in part on an output of the digital subtractor circuit.

9. The method of claim 8, wherein the filtered digital signal generated by the digital filtering component is a downsampled filtered digital signal, the digital subtractor circuit subtracts the downsampled filtered digital signal from the second digital signal, and the digital adder circuit generates the blended digital signal based at least in part on the output of the digital subtractor circuit and the first digital signal.

10. The method of claim 8, wherein the digital subtractor circuit subtracts the filtered digital signal from the first digital signal, and the digital adder circuit generates the blended digital signal based at least in part on the output of the digital subtractor circuit and the second digital signal.

11. The method of claim 8, wherein the digital filtering component comprises a digital low pass filter configured to match a cutoff frequency and a roll off rate of the analog low pass filter.

12. The method of claim 8, wherein the first ADC is configured for high-frequency fidelity and the second ADC is configured for low-frequency fidelity.

13. The method of claim 8, wherein the first digital signal comprises an interleaved digital signal.

14. The method of claim 8, further comprising processing, by the digital test and measurement device, the blended digital signal to provide a particular instrument-based functionality comprising at least one of: oscilloscope functionality, spectrum analyzer functionality, waveform generator functionality, data logger functionality, arbitrary waveform generator functionality, FIR filter builder, PID controller functionality, laser lock box functionality, lock-in amplifier functionality, frequency response analyzer functionality, phasemeter functionality, or digital filter box functionality.

15. The method of claim 8, further comprising transmitting, by the digital test and measurement device, an instrument functionality output to a computing device.

16. A digital test and measurement device comprising:
- a first analog-to-digital converter (ADC) that converts an analog signal into a first digital signal, the first ADC comprising a first sampling rate;
- a digital filtering component that generates a filtered digital signal by processing the first digital signal;
- an analog low pass filter that filters the analog signal to generate a filtered analog signal;
- a second ADC that converts the filtered analog signal into a second digital signal, the second ADC comprising a second sampling rate that is lower than the first sampling rate;
- a digital subtractor circuit that subtracts the filtered digital signal from the first digital signal or the second digital signal; and
- a digital adder circuit that generates a blended digital signal based at least in part on an output of the digital subtractor circuit.

17. The digital test and measurement device of claim 16, wherein the filtered digital signal generated by the digital filtering component is a downsampled filtered digital signal, the digital subtractor circuit subtracts the downsampled filtered digital signal from the second digital signal, and the digital adder circuit generates the blended digital signal based at least in part on the output of the digital subtractor circuit and the first digital signal.

18. The digital test and measurement device of claim 16, wherein the digital filtering component comprises a digital low pass filter is configured to match a cutoff frequency and a roll off rate of the analog low pass filter.

19. The digital test and measurement device of claim 16, wherein the first ADC is configured for high-frequency fidelity and the second ADC is configured for low-frequency fidelity.

\* \* \* \* \*